United States Patent
Hwang

(10) Patent No.: US 8,420,945 B2
(45) Date of Patent: Apr. 16, 2013

(54) PACKAGE SUBSTRATE, SEMICONDUCTOR PACKAGE HAVING THE PACKAGE SUBSTRATE

(75) Inventor: Yi-Sung Hwang, Asan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 234 days.

(21) Appl. No.: 12/882,620

(22) Filed: Sep. 15, 2010

(65) Prior Publication Data
US 2011/0103031 A1 May 5, 2011

(30) Foreign Application Priority Data
Nov. 4, 2009 (KR) .......................... 10-2009-0105902

(51) Int. Cl.
*H05K 1/03* (2006.01)
(52) U.S. Cl.
USPC .......................................... 174/255; 361/783
(58) Field of Classification Search .................. 174/250, 174/255, 260, 261; 257/686, 678, 690, 685, 257/723, 777, 784; 361/748, 728, 729, 736, 361/783
See application file for complete search history.

(56) References Cited

U.S. PATENT DOCUMENTS

| 2005/0212092 A1* | 9/2005 | Nishizawa | 257/622 |
| 2006/0181299 A1* | 8/2006 | Hirae | 324/765 |
| 2006/0202201 A1* | 9/2006 | Maruyama | 257/48 |
| 2009/0147490 A1* | 6/2009 | Kawabata | 361/783 |

FOREIGN PATENT DOCUMENTS

| JP | 2002-232115 A | 8/2002 |
| KR | 10-0439308 B1 | 7/2004 |
| KR | 1020040080787 A | 9/2004 |

* cited by examiner

*Primary Examiner* — Yuriy Semenenko
(74) *Attorney, Agent, or Firm* — Harness, Dickey & Pierce, P.L.C.

(57) ABSTRACT

A package substrate may include an insulating substrate, first circuit patterns, second circuit patterns and a test pattern. The first circuit patterns may be arranged on the insulating substrate. The second circuit patterns may be arranged on the insulating substrate. The second circuit patterns may be arranged between the first circuit patterns. The test pattern may be electrically connected between same polar terminals of the first circuit patterns and the second circuit patterns. Thus, electrical connections between the semiconductor chip and the circuit patterns may be tested before performing a process for cutting the package substrate.

8 Claims, 4 Drawing Sheets

PACKAGE SUBSTRATE, SEMICONDUCTOR PACKAGE HAVING THE PACKAGE SUBSTRATE

CROSS-RELATED APPLICATION

This application claims priority under 35 USC §119 to Korean Patent Application No. 2009-105902, filed on Nov. 4, 2009 in the Korean Intellectual Property Office (KIPO), the contents of which are herein incorporated by reference in their entirety.

BACKGROUND

1. Field

Example embodiments relate to a package substrate, a semiconductor package having the package substrate, and a method of manufacturing the semiconductor package. More particularly, example embodiments relate to a package substrate used for packaging a semiconductor chip, a semiconductor package having the package substrate, and a method of manufacturing the semiconductor package.

2. Description of the Related Art

Generally, a plurality of semiconductor fabrication processes may be performed on a semiconductor substrate to form a plurality of semiconductor chips. In order to mount the semiconductor chips on a printed circuit board (PCB), a packaging process may be performed on the semiconductor chips to form semiconductor packages.

The packaging process may include mounting the semiconductor chip on a package substrate, electrically connecting the semiconductor chip with the package substrate, molding the package substrate and the semiconductor chip, mounting external terminals on the package substrate, cutting the package substrate to singulate semiconductor packages, and testing electrical connections and operations of the semiconductor package.

The conventional package substrate may include circuit patterns having an anode terminal and a cathode terminal. The anode terminal and the cathode terminal may be electrically connected with each other. Thus, it may be possible to test the electrical connections and the operations of the semiconductor package, after cutting a line between the anode terminal and the cathode terminal.

That is, it may be possible to perform the test process after completing the semiconductor package. Therefore, a semiconductor package determined to be abnormal may be scrapped. As a result, a yield of the semiconductor package manufactured by the conventional packaging process may be considerably low.

SUMMARY

Example embodiments provide a package substrate that may be capable of allowing a test of electrical connections between the package substrate and a semiconductor chip before performing a process for cutting the package substrate.

Example embodiments also provide a semiconductor package having the above-mentioned package substrate.

Example embodiments still also provide a method of manufacturing a semiconductor package having the above-mentioned semiconductor package.

According to some example embodiments, there is provided a package substrate. The package substrate may include an insulating substrate, first circuit patterns, second circuit patterns and a test pattern. The first circuit patterns may be arranged on the insulating substrate. The second circuit patterns may be arranged on the insulating substrate. The second circuit patterns may be arranged between the first circuit patterns. The test pattern may be electrically connected between same polar terminals of the first circuit patterns and the second circuit patterns.

In some example embodiments, the first circuit patterns may be arranged in a first row. The second circuit patterns may be arranged in a second row. Each of the first circuit patterns may include a first anode terminal extending in a first direction, and a first cathode terminal. Each of the second circuit patterns may include a second anode terminal extending in a second direction substantially opposite to the first direction, and a second cathode terminal. The first cathode terminal and the second cathode terminal may extend in a third direction substantially perpendicular to the first direction.

In some example embodiments, the test pattern may include an anode test line electrically connected between the first anode terminal and the second anode terminal, and a cathode test line electrically connected between the first cathode terminal and the second cathode terminal.

In some example embodiments, the anode test line may include a main anode line, a first auxiliary anode line and a second auxiliary anode line. The main anode line may extend in the first direction. The first auxiliary anode line may extend from the main anode line. The first auxiliary anode line may be electrically connected with the first anode terminal of each of the first circuit patterns and the second anode terminal of each of the second circuit patterns in the first row. The second auxiliary anode line may extend from the main anode line between the first circuit patterns and the second circuit patterns. The second auxiliary anode line may be electrically connected together with the first anode terminal and the second anode terminal of the adjacent first and second circuit patterns in the second row.

In some example embodiments, the cathode test line may include a main cathode line, a first auxiliary cathode line and a second auxiliary cathode line. The main cathode line may extend in the first direction. The first auxiliary cathode line may extend from the main cathode line. The first auxiliary cathode line may be electrically connected with the first cathode terminal of each of the first circuit patterns and the second cathode terminal of each of the second circuit patterns in the second row. The second auxiliary cathode line may extend from the main cathode line between the first circuit patterns and the second circuit patterns. The second auxiliary cathode line may be electrically connected together with the first cathode terminal and the second cathode terminal of the adjacent first and second circuit patterns in the first row.

According to some example embodiments, there is provided a semiconductor package. The semiconductor package may include a package substrate, semiconductor chips and a molding member. The package substrate may include an insulating substrate, first circuit patterns, second circuit patterns and a test pattern. The first circuit patterns may be arranged on the insulating substrate. The second circuit patterns may be arranged on the insulating substrate. The second circuit patterns may be arranged between the first circuit patterns. The test pattern may be electrically connected between same polar terminals of the first circuit patterns and the second circuit patterns. The semiconductor chips may be mounted on the insulating substrate. The semiconductor chips may be electrically connected with the first circuit patterns and the second circuit patterns. The molding member may be formed on the semiconductor chips.

In some example embodiments, the semiconductor package may further include external terminals mounted on the package substrate.

According to some example embodiments, there is provided a method of manufacturing a semiconductor package. In the method of manufacturing the semiconductor package, semiconductor chips may be mounted on a package substrate. The package substrate may include a package substrate, semiconductor chips and a molding member. The package substrate may include an insulating substrate, first circuit patterns, second circuit patterns and a test pattern. The first circuit patterns may be arranged on the insulating substrate. The second circuit patterns may be arranged on the insulating substrate. The second circuit patterns may be arranged between the first circuit patterns. The test pattern may be electrically connected between same polar terminals of the first circuit patterns and the second circuit patterns. The semiconductor chips may be electrically connected with the first circuit patterns and the second circuit patterns. Electrical connections between the semiconductor chips and the first and second circuit patterns may be tested using the test pattern. The semiconductor chips and the package substrate may be molded.

In some example embodiments, testing the electrical connections may be performed after molding the semiconductor chips and the package substrate.

According to some example embodiments, the test pattern may include an anode test line electrically connected between the first anode terminal and the second anode terminal, and a cathode test line electrically connected between the first cathode terminal and the second cathode terminal. Because the anode terminal and the cathode terminal of the circuit patterns may be electrically isolated from each other, the electrical connections between the semiconductor chip and the circuit patterns may be tested before performing a process for cutting the package substrate. As a result, it may be possible to repair a semiconductor chip determined to be abnormal, before completing the semiconductor package, so that a yield of the semiconductor package may be remarkably improved.

BRIEF DESCRIPTION OF THE DRAWINGS

Example embodiments will be more clearly understood from the following detailed description taken in conjunction with the accompanying drawings.

FIG. 1 is a plan view illustrating a package substrate in accordance with some example embodiments;

FIG. 2 is an enlarged plan view illustrating a portion "II" in FIG. 1;

FIG. 3 is a cross-sectional view illustrating a semiconductor package in accordance with some example embodiments; and FIGS. 4 to 9 are cross-sectional views and a plan view illustrating a method of manufacturing the semiconductor package in FIG. 3.

DETAILED DESCRIPTION OF THE EMBODIMENTS

Figure 1:
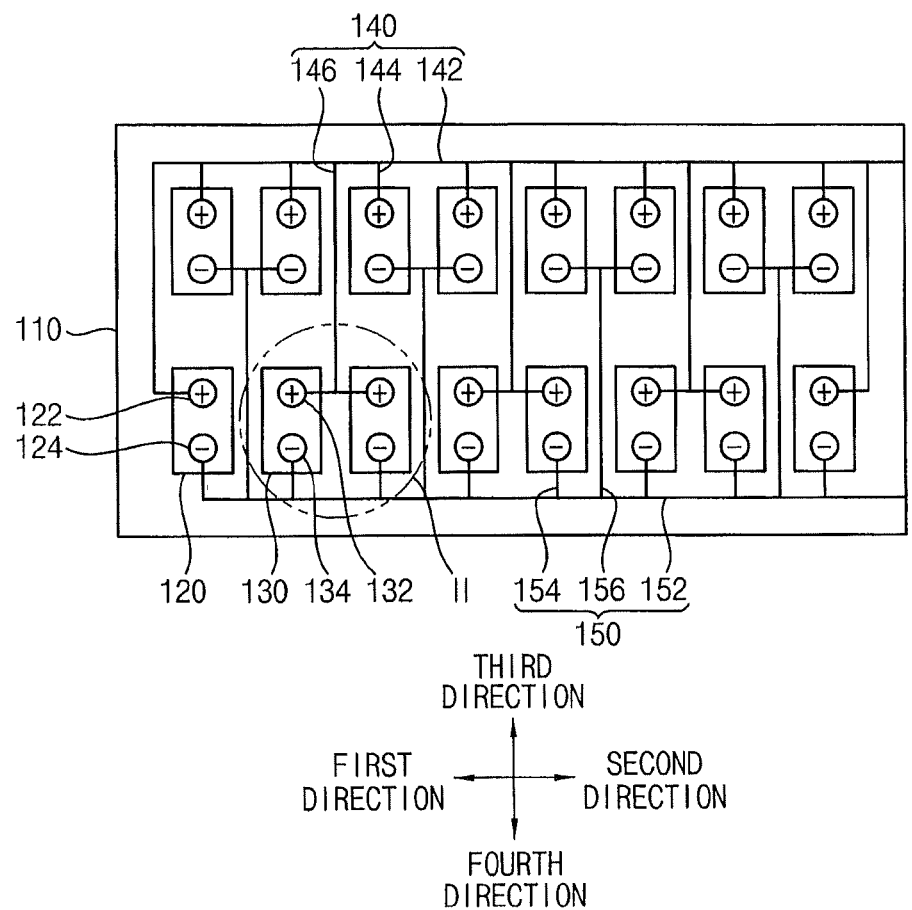
FIGS. 1 to 9 represent non-limiting, example embodiments as described herein.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Package Substrate

Figure 2:
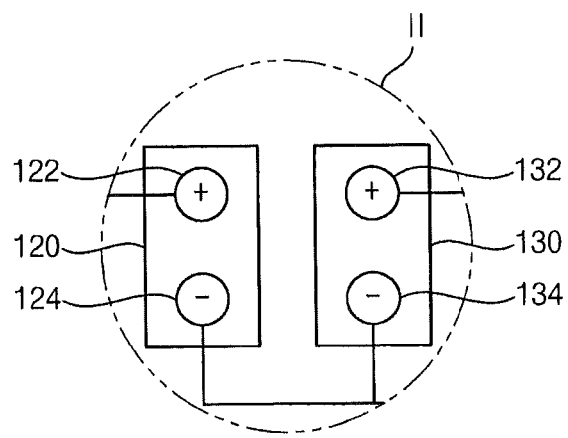

FIG. 1 is a plan view illustrating a package substrate in accordance with some example embodiments, and FIG. 2 is an enlarged plan view illustrating a portion "II" in FIG. 1.

Referring to FIGS. 1 and 2, a package substrate 100 of this example embodiment may include an insulating substrate 110, first circuit patterns 120, second circuit patterns 130 and a test pattern.

In some example embodiments, the insulating substrate 110 may have a rectangular thin plate shape. The insulating substrate 110 may include an insulating material such as insulating resin, polyimide, etc.

In some example embodiments, the first circuit patterns 120 and the second circuit patterns 130 may be arranged on an upper surface of the insulating substrate 110. Alternatively, the first circuit patterns 120 and the second circuit patterns 130 may be arranged on a lower surface of the insulating substrate 110. The first circuit patterns 120 and the second circuit patterns 130 may be arranged in a first row and a second row.

The first circuit patterns 120 may be arranged in a first direction. Each of the first circuit patterns 120 may include a first anode terminal 122 and a first cathode terminal.

The second circuit patterns 130 may be arranged in the first direction. The second circuit patterns 130 may be located between the first circuit patterns 120. That is, the first circuit patterns 120 and the second circuit patterns 130 may be alternately arranged. Each of the second circuit patterns 130 may include a second anode terminal 132 and a second cathode terminal 134.

In some example embodiments, the first anode terminal 122 of the first circuit patterns 120 and the second anode terminal 132 of the second circuit patterns 130 in the first row may extend in a third direction substantially perpendicular to the first direction. Further, the first cathode terminal of the first circuit patterns 120 and the second cathode terminal 134 of the second circuit patterns 130 in the second row may extend in a fourth direction substantially opposite to the third direction.

In some example embodiments, the first cathode terminal 124 of the first circuit patterns 120 in the first row may extend in a second direction substantially opposite to the first direction. In contrast, the second cathode terminal 134 of the second circuit patterns 130 in the first row may extend in the first direction. Thus, the first cathode terminal 124 and the second cathode terminal 134 adjacent to each other in the first row may be electrically connected with each other.

In some example embodiments, the first anode terminal 122 of the first circuit patterns 120 in the second row may extend in the first direction. In contrast, the second anode terminal 132 of the second circuit patterns 130 in the second row may extend in the second direction. Thus, the first anode terminal 122 and the second anode terminal 132 adjacent to each other in the second row may be electrically connected with each other.

The test pattern may be arranged on the insulating substrate 110. The test pattern may be electrically connected between the same polar terminals (for example, + or −) of the first circuit patterns 120 and the second circuit patterns 130.

In some example embodiments, the test pattern may include an anode test line 140 and a cathode test line 150. The anode test line 140 may be electrically connected between the first anode terminal 122 and the second anode terminal 132. The cathode test line 150 may be electrically connected between the first cathode terminal 124 and the second cathode terminal 134.

In some example embodiments, the anode test line 140 may include a main anode line 142, first auxiliary anode lines 144 and second auxiliary anode lines 146. The main anode line 142 may extend in the first direction. The first auxiliary anode lines 144 may be electrically connected to the first anode terminal 122 of the first circuit pattern 120 and the second anode terminal 132 of the second circuit patterns 130 in the first row. The second auxiliary anode lines 146 may extend between the first circuit patterns 120 and the second circuit patterns 130. Each of the second auxiliary anode lines 146 may be electrically connected together with the first anode terminal 122 and the second anode terminal 132 of the adjacent first and second circuit patterns 120 and 130 in the second row. That is, the single second auxiliary anode line 146 may be connected together with the two first and second anode terminals 122 and 132 in the second row.

In some example embodiments, the anode test line 150 may include a main cathode line 152, first auxiliary cathode lines 154 and second auxiliary cathode lines 156. The main cathode line 152 may extend in the first direction. The first auxiliary cathode lines 154 may be electrically connected to the first cathode terminal 124 of the first circuit pattern 120 and the second cathode terminal 134 of the second circuit patterns 130 in the second row. The second auxiliary cathode lines 156 may extend between the first circuit patterns 120 and the second circuit patterns 130. Each of the second auxiliary cathode lines 156 may be electrically connected together with the first cathode terminal 124 and the second cathode terminal 134 of the adjacent first and second circuit patterns 120 and 130 in the first row. That is, the single second auxiliary cathode line 156 may be connected together with the two first and second cathode terminals 124 and 134 in the first row.

Therefore, the anode terminals 122 and 132 and the cathode terminals 123 and 134 of the first and second circuit patterns 120 and 130 may be electrically isolated from each other by the arrangements of the test pattern. The electrically isolated anode terminals 122 and 132 and the cathode terminal 124 and 134 may be electrically connected with each other via semiconductor chips mounted on the first circuit patterns 120 and the second circuit patterns 130.

According to this example embodiment, the same polar terminals may be electrically connected with each other. In contrast, the oppositely polar terminals may be electrically isolated from each other. Therefore, after mounting the semiconductor chips on the circuit patterns, it may be possible to test electrical connections such as a short between the semiconductor chips and the circuit patterns.

Semiconductor Package

Figure 3:
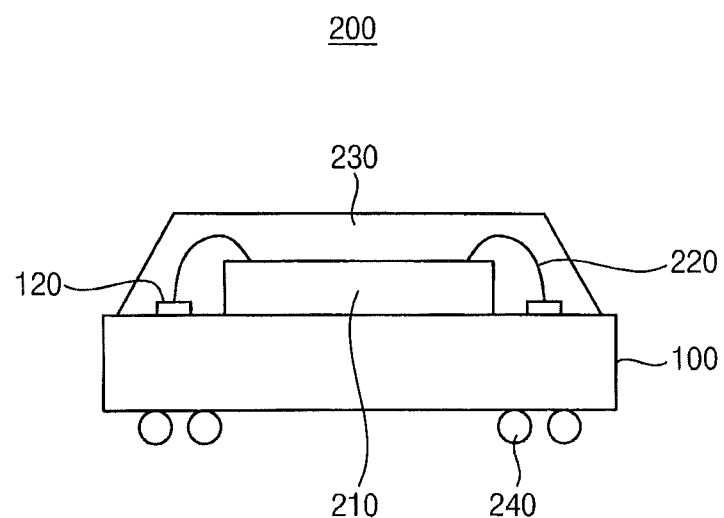

FIG. 3 is a cross-sectional view illustrating a semiconductor package in accordance with some example embodiments.

Referring to FIG. 3, a semiconductor package 200 of this example embodiment may include a package substrate 100, a semiconductor chip 210, conductive connecting members 220, a molding member 230 and external terminals 240.

Here, the package substrate 100 may be substantially the same as the package substrate in FIG. 1. Thus, any further illustrations with respect to the package substrate 100 are omitted herein for brevity.

The semiconductor chip 210 may be mounted on the circuit pattern 120 of the package substrate 100. Bonding pads (not shown) may be formed on an upper surface of the semiconductor chip 210.

The conductive connecting members 220 may be electrically connected between the bonding pads and the circuit patterns 120. In some example embodiments, the conductive connecting members 220 may include a metal wire such as a gold wire.

The molding member 230 may be formed on the package substrate 100 and the semiconductor chip 210 to cover the conductive connecting members 220. In some example embodiments, the molding member 230 may include an epoxy molding compound (EMC).

The external terminals 240 may be mounted on a lower surface of the package substrate 100. The external terminals 240 may be electrically connected to the circuit patterns 120. Thus, the semiconductor chip 210 may be electrically connected to the external terminals 240 via the conductive connecting members 220 and the circuit patterns 120. In some example embodiments, the external terminals 240 may include a solder ball.

Here, the semiconductor package 200 of this example embodiment may include the wires. Alternatively, the package substrate 100 may be applied to other semiconductor packages such as a flip chip package.

Method of Manufacturing a Semiconductor Package

FIGS. 4 to 9 are cross-sectional views and a plan view illustrating a method of manufacturing the semiconductor package in FIG. 3.

Figure 4:
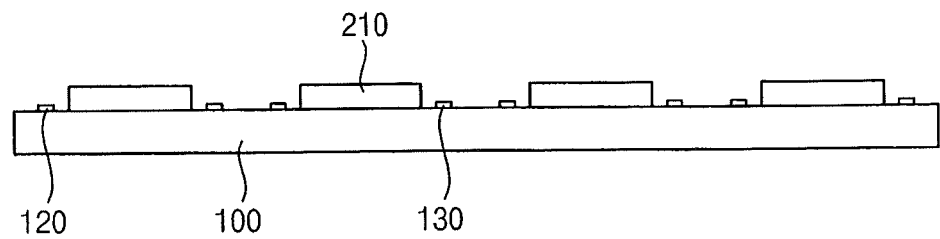

Referring to FIG. 4, the semiconductor chips 210 may be mounted on the upper surface of the package substrate 100. Here, the package substrate 100 may be substantially the same as the package substrate in FIG. 1. Thus, any further illustrations with respect to the package substrate 100 are omitted herein for brevity.

Figure 5:
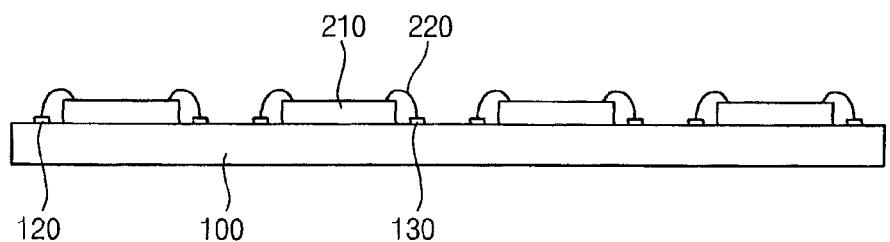

Referring to FIG. 5, the bonding pads of the semiconductor chip 210 may be electrically connected with the circuit patterns 120 and 130 of the package substrate 100 using the conductive connecting members 220.

Figure 6:
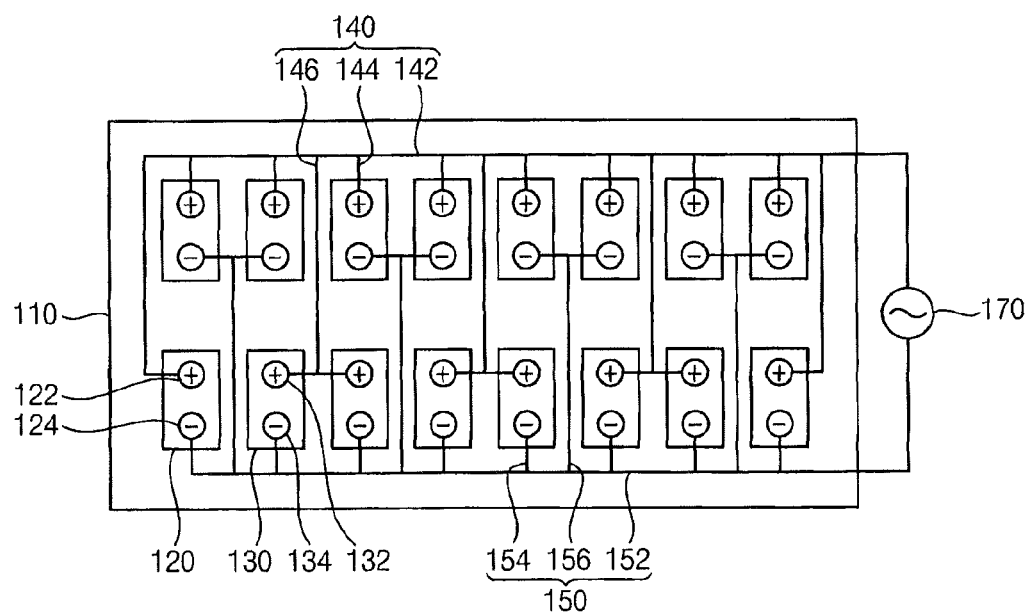

Referring to FIG. 6, a power supply 170 may be connected to the test pattern 140 and 150. As mentioned above, the anode terminals 122 and 132 of the first and second circuit patterns 120 and 130 may be electrically connected with each other via the anode test line 140. The cathode terminals 124 and 134 of the first and second circuit patterns 120 and 130 may be electrically connected with each other via the cathode test line 150. That is, the anode terminals 122 and 132 may not be directly connected to the cathode terminals 124 and 134. In contrast, the anode terminals 122 and 132 may be indirectly connected to the cathode terminals 124 and 134 through the semiconductor chips 210 and the conductive connecting members 220.

Therefore, when a test current may be supplied to the test pattern 140 and 150 from the power supply 170, the test current may flow from the anode test line 140 to the cathode test line 150 through the anode terminals 122 and 132, the conductive connecting members 220 and the semiconductor chips 210. Electrical connections such as a short between the semiconductor chips 210 and the circuit patterns 120 and 130 may be determined based on the test current. Here, because the semiconductor chips 210 may not be molded, it may be possible to repair a semiconductor chip 210 determined to be abnormal.

Figure 7:
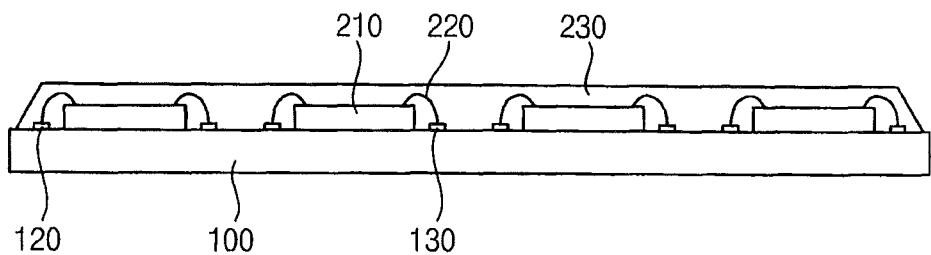

Referring to FIG. 7, the molding member 230 may be formed on the package substrate 100 and the semiconductor chips 210 to cover the conductive connecting members 220.

Figure 8:
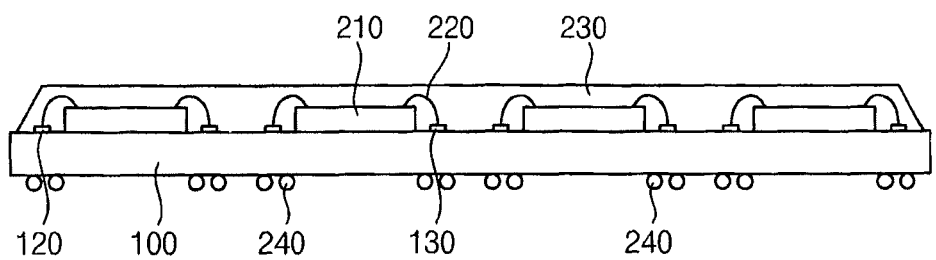

Referring to FIG. 8, the external terminals 240 such as the solder balls may be mounted on the lower surface of the package substrate 100.

Figure 9:
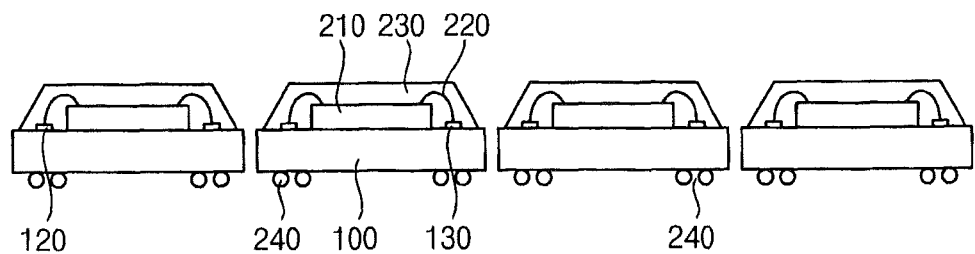

Referring to FIG. 9, the package substrate 100 may be cut to divide the package substrate 100 into the semiconductor chips 210, thereby completing the semiconductor package 200.

Here, in this example embodiment, the test process may be performed right after the wiring bonding process. Alternatively, because the anode terminals 122 and 132 and the cathode terminals 124 and 134 may be electrically isolated from each other, the test process may be performed between the wiring bonding process and the cutting process.

According to these example embodiments, the test pattern may include an anode test line electrically connected between the first anode terminal and the second anode terminal, and a cathode test line electrically connected between the first cathode terminal and the second cathode terminal. Because the anode terminal and the cathode terminal of the circuit patterns may be electrically isolated from each other, the electrical connections between the semiconductor chip and the circuit patterns may be tested before performing a process for cutting the package substrate. As a result, it may be possible to repair a semiconductor chip determined to be abnormal, before completing the semiconductor package, so that a yield of the semiconductor package may be remarkably improved.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A package substrate comprising:
an insulating substrate;
first circuit patterns arranged on the insulating substrate;
second circuit patterns arranged on the insulating substrate, the second circuit patterns and the first circuit patterns being alternately arranged in a first row and a second row;
a test pattern electrically connected between same polar terminals of the first circuit patterns and the second circuit patterns, wherein
each of the first circuit patterns comprises a first anode terminal extending in a first direction and a first cathode terminal, each of the second circuit patterns comprises a second anode terminal extending in a second direction substantially opposite to the first direction and a second cathode terminal, and the test pattern comprises an anode test line electrically connected between the first anode terminal and the second anode terminal, and the anode test line comprises:

a main anode line extending in the first direction, a first auxiliary anode line extending from the main anode line, the first auxiliary anode line electrically connected with the first anode terminal of each of the first circuit patterns and the second anode terminal of each of the second circuit patterns in the first row, and a second auxiliary anode line extending from the main anode line, the second auxiliary anode line electrically connected together with the first and second anode terminals of the first and second circuit patterns adjacent to each other in the second row.

2. The package substrate of claim 1, wherein the first cathode terminal and the second cathode terminal extend in a third direction substantially perpendicular to the first direction.

3. A semiconductor package comprising:

a package substrate including an insulating substrate, first circuit patterns arranged on the insulating substrate, second circuit patterns arranged on the insulating substrate, the second circuit patterns and the first circuit patterns being alternately arranged in a first row and a second row, and a test pattern electrically connected between same polar terminals of the first circuit patterns and the second circuit patterns, wherein each of the first circuit patterns comprises a first anode terminal extending in a first direction and a first cathode terminal, each of the second circuit patterns comprises a second anode terminal extending in a second direction substantially opposite to the first direction and a second cathode terminal, and the test pattern comprises an anode test line electrically connected between the first anode terminal and the second anode terminal, and the anode test line comprises:

a main anode line extending in the first direction, a first auxiliary anode line extending from the main anode line, the first auxiliary anode line electrically connected with the first anode terminal of each of the first circuit patterns and the second anode terminal of each of the second circuit patterns in the first row, and a second auxiliary anode line extending from the main anode line, the second auxiliary anode line electrically connected together with the first and second anode terminals of the first and second circuit patterns adjacent to each other in the second row;

a semiconductor chip mounted on the insulating substrate and electrically connected to the first circuit patterns and the second circuit patterns; and a molding member formed on the semiconductor chip.

4. The semiconductor package of claim 3, further comprising external terminals mounted on the package substrate.

5. A package substrate comprising:

an insulating substrate;

first circuit patterns arranged on the insulating substrate;

second circuit patterns arranged on the insulating substrate, the second circuit patterns and the first circuit patterns being alternately arranged in a first row and a second row;

a test pattern electrically connected between same polar terminals of the first circuit patterns and the second circuit patterns, wherein each of the first circuit patterns comprises a first anode terminal extending in a first direction and a first cathode terminal, each of the second circuit patterns comprises a second anode terminal extending in a second direction substantially opposite to the first direction and a second cathode terminal, and the test pattern comprises a cathode test line electrically connected between the first cathode terminal and the second cathode terminal, and the cathode test line comprises:

a main cathode line extending in the first direction, a first auxiliary cathode line extending from the main cathode line, the first auxiliary cathode line electrically connected with the first cathode terminal of each of the first circuit patterns and the second cathode terminal of each of the second circuit patterns in the second row, and a second auxiliary cathode line extending from the main cathode line, the second auxiliary cathode line electrically connected together with the first and second cathode terminals of the first and second circuit patterns adjacent to each other in the first row.

6. The package substrate of claim 5, wherein the first cathode terminal and the second cathode terminal extend in a third direction substantially perpendicular to the first direction.

7. A semiconductor package comprising:

a package substrate including an insulating substrate, first circuit patterns arranged on the insulating substrate, second circuit patterns arranged on the insulating substrate, the second circuit patterns and the first circuit patterns being alternately arranged in a first row and a second row, and a test pattern electrically connected between same polar terminals of the first circuit patterns and the second circuit patterns, wherein each of the first circuit patterns comprises a first anode terminal extending in a first direction and a first cathode terminal, each of the second circuit patterns comprises a second anode terminal extending in a second direction substantially opposite to the first direction and a second cathode terminal, and the test pattern comprises a cathode test line electrically connected between the first cathode terminal and the second cathode terminal, and the cathode test line comprises:

a main cathode line extending in the first direction, a first auxiliary cathode line extending from the main cathode line, the first auxiliary cathode line electrically connected with the first cathode terminal of each of the first circuit patterns and the second cathode terminal of each of the second circuit patterns in the second row, and a second auxiliary cathode line extending from the main cathode line, the second auxiliary cathode line electrically connected together with the first and second cathode terminals of the first and second circuit patterns adjacent to each other in the first row.

8. The semiconductor package of claim 7, further comprising external terminals mounted on the package substrate.

* * * * *